(12) United States Patent
Lee et al.

(10) Patent No.: US 11,764,001 B2
(45) Date of Patent: Sep. 19, 2023

(54) PEROVSKITE SOLAR CELL CONFIGURATIONS

(71) Applicants: University of Pittsburgh-Of the Commonwealth System of Higher Education, Pittsburgh, PA (US); Global Frontier Center for Multiscale Energy Systems, Seoul (KR)

(72) Inventors: Jung-Kun Lee, Pittsburgh, PA (US); Gillsang Han, Pittsburgh, PA (US)

(73) Assignee: University of Pittsburgh-Of the Commonwealth System of Higher Education, Pittsburgh, PA (US)

( * ) Notice: Subject to any disclaimer, the term of this patent is extended or adjusted under 35 U.S.C. 154(b) by 0 days.

(21) Appl. No.: 16/630,568

(22) PCT Filed: Jul. 20, 2018

(86) PCT No.: PCT/US2018/043043
§ 371 (c)(1),
(2) Date: Jan. 13, 2020

(87) PCT Pub. No.: WO2019/023052
PCT Pub. Date: Jan. 31, 2019

(65) Prior Publication Data
US 2020/0176196 A1    Jun. 4, 2020

Related U.S. Application Data

(60) Provisional application No. 62/536,111, filed on Jul. 24, 2017.

(51) Int. Cl.
| H01G 9/20   | (2006.01) |
| H01G 9/00   | (2006.01) |
| H01L 31/0725| (2012.01) |
| H10K 30/35  | (2023.01) |
| H10K 30/82  | (2023.01) |

(52) U.S. Cl.
CPC ......... *H01G 9/2031* (2013.01); *H01G 9/0029* (2013.01); *H01G 9/204* (2013.01);
(Continued)

(58) Field of Classification Search
CPC ..... H01L 51/44; H01L 51/441; H01L 51/442; H01L 31/0224;
(Continued)

(56) References Cited

U.S. PATENT DOCUMENTS

2016/0071655 A1* 3/2016 Li ................... H01L 31/1888
136/254

FOREIGN PATENT DOCUMENTS

| CN | 106229327 A   | * 12/2016 | ............. H01L 27/30 |
| EP | 2272666 A2    |   1/2011  |                         |
| WO | WO-2016181911 A1 | * 11/2016 | ............. H01L 51/46 |

OTHER PUBLICATIONS

Chen et al. ("Achieving high-performance planar perovskite solar cell with Nb-doped TiO2 compact layer by enhanced electron injection and efficient charge extraction"); J. Mater. Chem A, 2016, 4, 5647-5653.*

(Continued)

*Primary Examiner* — Christina Chern
(74) *Attorney, Agent, or Firm* — Philip E. Levy; Eckert Seamans Cherin & Mellott, LLC

(57) ABSTRACT

Various perovskite solar cell embodiments include a flexible metal substrate (e.g., including a metal doped TiO2 layer), a perovskite layer, and a transparent electrode layer (e.g., including a dielectric/metal/dielectric structure), wherein the perovskite layer is provided between the flexible metal substrate and the transparent electrode layer. Also, various tandem solar cell embodiments including a perovskite solar cell and either a quantum dot solar cell, and organic solar cell or a thin film solar cell.

18 Claims, 2 Drawing Sheets

(52) U.S. Cl.
CPC ....... *H01G 9/2027* (2013.01); *H01L 31/0725* (2013.01); *H10K 30/35* (2023.02); *H10K 30/82* (2023.02)

(58) Field of Classification Search
CPC .......... H01L 31/022466–022491; H01G 9/04; H01G 9/048; H01G 9/20; H01G 9/2022; H01G 9/2031; H01G 9/2095
See application file for complete search history.

(56) References Cited

OTHER PUBLICATIONS

Pathaketai. ("Performance and Stability Enhancement of Dye-Sensitized and Perovskite Solar Cells by Al Doping of TiO2"); Adv. Funct. Mater., 2014, 24, 6046-6055.*
English machine translation of Tanaka et al. (WO 2016/181911), published Nov. 17, 2016.*
English machine translation of Chen et al. (CN 106229327) published Dec. 14, 2016.*
Lee, S. Flexible perovskite solar cell on metal plate (Doctoral dissertation, University of Pittsburgh) Jun. 13, 2017 (online), [retrieved on Sep. 19, 2018). Retrieved from the Internet <http://d-scholarship.pitt.edu/31273/1 /Seongha%20Lee_etdPitt2017%28revised%29.pdf>; pp. 32-34, 39, 41, 48.
Kang, Yet al. Multilayer transparent top electrode for solution processed perovskite/Cu (In, Ga) (Se, S) 2 four terminal tandem solar cells. ACS nano. Jun. 26, 2015. vol. 9. No. 7; figure 2, p. 7717.

* cited by examiner

PEROVSKITE SOLAR CELL CONFIGURATIONS

CROSS-REFERENCE TO RELATED APPLICATIONS

This application is a U.S. National Stage Application under 35 U.S.C. § 371 of PCT International Application No. PCT/US2018/043043, filed on Jul. 20, 2018, entitled "Perovskite Solar Cell Configurations" which claims priority under 35 U.S.C. § 119(e) from U.S. provisional patent application No. 62/536,111, filed on Jul. 24, 2017, entitled "Perovskite Solar Cell Configurations", the contents of which are incorporated herein by reference.

BACKGROUND OF THE INVENTION

1. Field of the Invention

The present invention relates to solar cells, and, in particular, to a number of perovskite solar cell configurations, such as, without limitation, flexible and stable perovskite solar cells.

2. Description of the Related Art

Solar energy has attracted huge attention as a promising alternative to fossil fuel energy (which is regarded as a major source of the green-house effect). However, to replace fossil fuel energy on a worthwhile scale, the manufacturing costs of solar cells need to be decreased and/or the power conversion efficiency (PCE) of solar cells needs to be increased. Recently, organic-inorganic perovskite semiconductors, such as halide perovskite ($CH_3NH_3PbX_3$, X=halogen ions), have been found to be an excellent light absorber for use in creating highly efficient and economically viable solar cells, known as halide perovskite solar cells (PSCs). Halide perovskites have outstanding optical and electronic properties, such as a high absorption coefficient ($>10^4$ $cm^{-1}$), a long carrier diffusion length ($>1$ μm), high carrier mobility (25 $cm^2$/Vs), and a suitable band gap spanning the energy of visible and near infrared light. In addition, simple and cheap synthesis processes can be applied to the large scale production of halide PSCs. Thus, this emerging hybrid solar cell has the potential to meet the urgent need for low cost and high efficiency power generation.

In a typical, known PSC device, a perovskite layer is coated on top of a mesoporous or planar titanium oxide ($TiO_2$) layer that is provided on a rigid transparent conducting oxide (TCO) substrate, such as indium tin oxide (ITO)/glass or fluorine doped tin oxide (FTO)/glass. Recent studies have shown that highly crystalline $TiO_2$ is necessary as an electron transport layer (ETL) for high efficiency PSCs. It is known that highly crystalline $TiO_2$ may be obtained by annealing the $TiO_2$ layer at a high temperature (e.g., 500° C.) before the perovskite layer is coated onto the $TiO_2$ layer. This process, however, cannot be applied to flexible polymer substrates, such as polyethylene terephthalate (PET) and polyethylene naphthalate (PEN), that are suitable for flexible electronics. To address this problem, the fabrication of n-type materials at low temperature (under 150° C.) has been explored. Specifically, in one example application, a low-temperature processed TiOx compact layer was deposited on an indium tin oxide/polyethylene naphthalate (ITO/PEN) substrate through atomic layer deposition (ALD) at 80° C., achieving a high power conversion efficiency (PCE) of 12.2%. It has also been reported that amorphous $TiO_2$ grown by magnetron sputtering at room temperature increases the PCE of PSCs on ITO/PEN to 15.07%. Moreover, in recent years, flexible PSCs of an inverted structure (p-i-n) were designed. The flexible inverted PSCs are composed of NiOx, PhNa-1T, or PEDOT: PSS as a p-type hole transport layer (HTL) on ITO/polymer substrates. The PCE of flexible inverted PSCs was only able to reach about 14.7%, which is not as good as the best performing PSCs on rigid substrates (>22%). Recent results indicate that there is a limitation in increasing the PCE of flexible PSCs without using high-temperature annealing of the $TiO_2$ layer. In addition, the mechanical strength of PSCs on ITO/polymer substrates is weak due to low fatigue resistance of thick ITO layers (ca. 200 nm). Since Poisson's ratio of ITO is smaller than that of CH3NH3PbI3, ITO is less bendable than CH3NH3PbI3. Consequently, as PSCs are bent repeatedly, a crack is formed in the ITO layer that propagates through the perovskite layer, resulting in the degradation of the PSCs.

There are several alternatives to ITO/plastic substrates, such as graphene coated polymers, surface treated metal plates and metal meshes. Among these alternative materials, a metal plate is an attractive candidate, due to the capability of high temperature annealing, low manufacturing cost, and excellent mechanical properties. In fact, there are several studies on PSCs and dye sensitized solar cells having a titanium metal plate as a substrate, but they are coated with an additional ETL instead of using the oxidized surface layer of Ti, and the PCE of these PSCs is less than 11%. Recently, a metal Ti film on FTO/glass substrate was oxidized to form an ETL of PSCs. However, such PSCs are not flexible and the PCE of such PSCs built on a surface oxidized Ti film/PTO/glass substrate has been only about 13%. In addition, this type of PSC suffers from hysteresis, which is attributed to the poor quality of ETL.

SUMMARY OF THE INVENTION

In one embodiment, a perovskite solar cell is provided that includes a flexible metal substrate including a metal foil layer, a perovskite layer, and a transparent electrode layer including a dielectric/metal/dielectric structure. The perovskite layer is provided between the flexible metal substrate and the transparent electrode layer, and the transparent electrode layer enables illumination of the perovskite layer through the transparent electrode layer.

In another embodiment, a perovskite solar cell is provided that includes a flexible metal substrate including a metal doped $TiO_2$ layer, a perovskite layer, and a transparent electrode layer, wherein the perovskite layer is provided between the flexible metal substrate and the transparent electrode layer.

In still another embodiment, a method of making a perovskite solar cell is provided. The method includes providing a foil layer, providing a layer of metal on top of the Ti foil layer, thermally oxidizing the Ti foil layer and the layer of metal to form a metal doped $TiO_2$ layer, providing a perovskite layer on top of the metal doped $TiO_2$ layer.

In yet another embodiment, a tandem solar cell is provided that includes a perovskite solar cell as described above, and a quantum dot solar cell or an organic solar cell. If a quantum dot solar cell is used, it includes a quantum dot layer, where the quantum dot layer is provided on top of the transparent electrode layer of the perovskite solar cell. If an organic solar cell is used, it includes a polymer layer, where the polymer layer is provided on top of the transparent electrode layer of the perovskite solar cell. A second transparent electrode layer including a dielectric/metal/dielectric structure is also included, wherein the second transparent electrode layer is provided on top of the quantum dot layer or the polymer layer.

In a further embodiment, an alternative tandem solar cell is provided that includes a thin-film solar cell, a first transparent electrode layer including a dielectric/metal/dielectric structure, wherein the first transparent electrode layer is provided on top of the thin-film solar cell, a perovskite layer provided on top of the first transparent electrode layer, and a second transparent electrode layer including a dielectric/metal/dielectric structure, wherein the second transparent electrode layer is provided on top of the thin-film solar cell.

In another embodiment, an alternative perovskite solar cell is provided that includes a substrate, a perovskite layer provided on the substrate, and a hole transport material layer provided on the perovskite layer, wherein the perovskite layer and the hole transport material layer together have a matched work function (i.e., a first work function) for hole transport from the perovskite layer to the hole transport layer. The perovskite solar cell further includes a transparent electrode layer including a dielectric/metal/dielectric structure, wherein the perovskite layer and the hole transport material layer are provided between the substrate and the transparent electrode layer, wherein the work function of the dielectric/metal/dielectric structure (i.e., a second work function) facilitates the hole transport from the hole transport layer to the transparent layer of the dielectric/metal/dielectric structure and matches the first work function.

In still a further embodiment, a method of making a perovskite solar cell including a perovskite layer, a hole transport material layer and a transparent electrode layer including a dielectric/metal/dielectric structure is provided, wherein the perovskite layer and the hole transport material layer together have a first work function. The method includes selecting dielectric and metal materials for the dielectric/metal/dielectric structure so that the dielectric/metal/dielectric structure has a second work function that matches the first work function, providing a substrate, providing the perovskite layer and the hole transport material layer on the substrate, and providing the transparent electrode layer on the perovskite layer and the hole transport material layer such that the perovskite layer and the hole transport material layer are provided between the substrate and the transparent electrode layer.

DETAILED DESCRIPTION OF EXEMPLARY EMBODIMENTS

Figure 1:
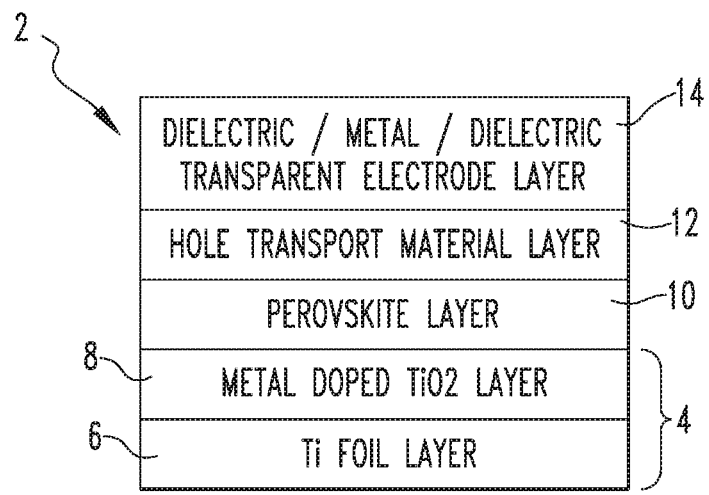
FIG. 1 is a schematic of a flexible perovskite solar cell according to an exemplary embodiment of the disclosed concept.

As used herein, the singular form of "a", "an", and "the" include plural references unless the context clearly dictates otherwise.

As used herein, the statement that two or more parts or components are "coupled" shall mean that the parts are joined or operate together either directly or indirectly, i.e., through one or more intermediate parts or components, so long as a link occurs.

As used herein, "directly coupled" means that two elements are directly in contact with each other.

As used herein, the term "number" shall mean one or an integer greater than one (i.e., a plurality).

As used herein, the term "perovskite" shall mean an organic-inorganic halide compound with a perovskite crystal structure.

As used herein, the term "dielectric/metal/dielectric structure" shall mean a structure where a metal is provided between two dielectric materials (e.g., a top dielectric material and a bottom dielectric) in a multilayer structure. In one particular, non-limiting implementation of a dielectric/metal/dielectric structure, the metal is provided directly on the top surface of the bottom dielectric material and the top dielectric material is provided directly on the top surface of the metal.

As used herein, the term "nanoscale" shall mean an object having a size (e.g., diameter or width) ranging from 1 nm to 1 μm (1,000 nm).

As used herein, the term "quantum dot" shall mean a nanoscale semiconductor particle.

As used herein, the term "quantum dot layer" shall mean a layer of material including a number of quantum dots.

As used herein, the term "thin-film solar cell" shall mean a solar cell having one or more thin layers/thin-films of photovoltaic material provided on a substrate, such as silicon (Si), glass, plastic or metal. The photovoltaic material may include, for example and without limitation, amorphous thin-film Si, cadmium telluride (CdTe), or copper indium gallium selenide (CIGS).

As used herein, the term "organic solar cell" shall mean a solar cell having one or more layers of photovoltaic material in the form of a conductive organic polymer for light absorption and charge transport to produce electricity provided on a substrate, such as a polymer substrate.

As used herein, the term "provided on" or "provided on top of" shall mean that an element or material is (i) provided directly on or on top of another element or material, or (ii) provided indirectly on or on top of another element or material with one or more intervening elements or materials being provided between the element or material and the another element or material.

Directional phrases used herein, such as, for example and without limitation, top, bottom, left, right, upper, lower, front, back, and derivatives thereof, relate to the orientation of the elements shown in the drawings and are not limiting upon the claims unless expressly recited therein.

The disclosed concept will now be described, for purposes of explanation, in connection with numerous specific details in order to provide a thorough understanding of the subject innovation. It will be evident, however, that the disclosed concept can be practiced without these specific details without departing from the spirit and scope of this innovation.

FIG. 1 is a schematic diagram of a flexible perovskite solar cell 2 according to an exemplary embodiment of the disclosed concept. As seen in the FIG. 1, perovskite solar cell 2 is a multi-layer structure, each layer of which is described in detail below.

Referring to FIG. 1, perovskite solar cell 2 includes a flexible metal substrate assembly 4 that comprises two parts: (i) a titanium foil layer 6, and (ii) a metal doped $TiO_2$ layer 8 provided on the top surface of titanium foil layer 6. In the exemplary embodiment, metal substrate assembly 4 is formed as follows. First, a thin (e.g., 0.5-5 nm) layer of a metal, such as, without limitation, aluminum (Al), tantalum (Ta), iron (Fe) or niobium (Nb), is coated onto the top surface of a titanium foil using a suitable method, such as e-beam evaporation, thermal evaporation or sputtering. The coated titanium foil is then thermally oxidized (annealed) at a high temperature (e.g., 300-700° C.) in a first annealing step. Ih the exemplary embodiment, the coated titanium foil is then further annealed at high temperature (e.g., 400° C.) in ambient oxygen. These annealing steps cause the coated metal to be doped into the oxide being formed from the titanium foil, which results in the formation of metal doped $TiO_2$ layer 8 on top of titanium foil layer 6 as shown in FIG. 1. The metal doped $TiO_2$ layer 8 as just described is beneficial because it increases current density of solar cells and eliminates hysteresis effects that are otherwise present in known PSC devices. More specifically, as described elsewhere herein, in a conventional PSC structure, $TiO_2$ nanoparticles are coated onto the surface of a transparent electrode coated glass as an electron transport layer. Such a $TiO_2$ nanoparticle layer, however, causes hysteresis of the J-V curve of the PSC device due to a dependence of electric current density on the electric field speed and direction. The metal doped $TiO_2$ layer 8 of the disclosed concept can eliminate this hysteresis effect by reducing the detect density of $TiO_2$ near the perovskite/$TiO_2$ interface and changing the surface charge status of the $TiO_2$ layer.

Perovskite solar cell 2 further includes a perovskite layer 10 that is provided on the top surface of metal substrate assembly 4. In the non-limiting exemplary embodiment, perovskite layer 10 is a layer of $CH_3NH_3PbI_3$ that is coated (using a suitable method such as spin coating) onto the top surface of metal substrate assembly 4, although other perovskites are contemplated within the scope of the disclosed concept. A hole transport material (HTM) layer 12 is provided on the top surface of perovskite layer 10 using a process such as spin coating. In the non-limiting exemplary embodiment, hole transport material layer 12 is made of poly(3,4-ethylenedioxythiophene) polystyrene sulfonate (PEDOT:PSS), although other suitable materials are contemplated within the scope of the disclosed concept.

Finally, a transparent electrode layer 14 is provided on the top surface of hole transport material layer 12. In the exemplary environment, transparent electrode layer 14 is a flexible dielectric/metal/dielectric multilayer structure wherein a metal material is sandwiched between two dielectric materials. In the exemplary embodiment, the three layers of the flexible dielectric/metal/dielectric multilayer structure are sequentially deposited using a physical vapor deposition method such as e-beam evaporation. The dielectric/metal/dielectric multilayer structure may be a number of different material combinations such as, without limitation, MoO/Au/MoO, $TiO_2$/Au/MoO, ZnO/Ag/NiO, MoO/Al/MoO or MoO/Ag/NiO.

Because both metal substrate assembly 4 and transparent electrode layer 14 in the form of the dielectric/metal/dielectric multilayer structure are flexible, perovskite solar cell 2 as a whole is very flexible/bendable and may be used in applications, such as wearable electronics, which require flexible components. This is in contrast to conventional PSC structures which, as described elsewhere herein, use transparent electrodes and/or coated glass substrates that are rigid. In fact, the present inventors have determined through experimental testing that perovskite solar cell 2 as described herein will not show cracks or degraded PCE after repeated bending (e.g., one test that was performed was a 1000 time-cyclic bending test at a bending radius of 4 mm).

Furthermore, it has been determined that perovskite solar cell 2 demonstrates enhanced stability under light illumination. In particular, aging of conventional PSCs under UV illumination is well-known and is attributed to the photovoltaic effect of UV light on the $TiO_2$ in such conventional PSCs. Perovskite solar cell 2 of the disclosed concept resolves this photo-aging problem by changing the light illumination direction to a top-illumination direction. In particular, in contrast to a conventional PSC structure wherein the light illumination is from the bottom direction, in perovskite solar cell 2, light is incident from the top direction through transparent electrode layer 14 comprising the dielectric/metal/dielectric multilayer structure. Since perovskite layer 10 in perovskite solar cell 2 will absorb UV light, metal doped $TiO_2$ layer will not be exposed to U V light and, as a result, reactive radical ions will not be produced during the solar power/electricity conversion process.

A further advantage of perovskite solar cell 2 is the fact that transparent electrode layer 14 that includes the dielectric/metal/dielectric multilayer structure functions as a passivation layer that prevents undesired aging of perovskite solar cell 2 due to humidity and oxygen in the air. Aging of current prior art PSCs due to humidity and oxygen in the air is a substantial problem which prevents commercialization of PSCs. According to an aspect of the disclosed concept, perovskite layer 10 is passivated by transparent electrode 14 such that perovskite layer 10 does not come into contact with air and such that water does not penetrate into the perovskite layer 10. As a result, undesirable aging of perovskite solar cell 2 is prevented. Furthermore, in a case where multiple perovskite solar cells 2 are used within a structure, the space between such unit cells may be covered by a dielectric layer using known deposition techniques such as e-beam deposition and atomic layer deposition, thereby increasing the passivation and protection of each of the unit cells.

One particular exemplary embodiment of the disclosed concept involves controlling the work function of transparent electrode layer 14 by designing the dielectric/metal/dielectric structure thereof in order to maximize electron flow and minimize electron accumulation in the semiconductor side of the semiconductor-electrode junction. As is known in the art, work function indicates the energy (for example, in Joules) that is required to excite electrons from Fermi level to vacuum level. The work function difference between two materials represents the easiness of electron (or hole) flow from one material to the other. In this particular exemplary embodiment, the specific materials of the dielectric/metal/dielectric structure of transparent electrode layer 14 are chosen so that transparent electrode layer 14 has a work function that is tuned to "match" the work function of the combination of perovskite layer 10 and hole transport material layer 12. As used herein, the work functions of two materials will be considered to "match" one another if the work function of one of the materials is within 15% of the work function of the other of the materials.

Figure 2:
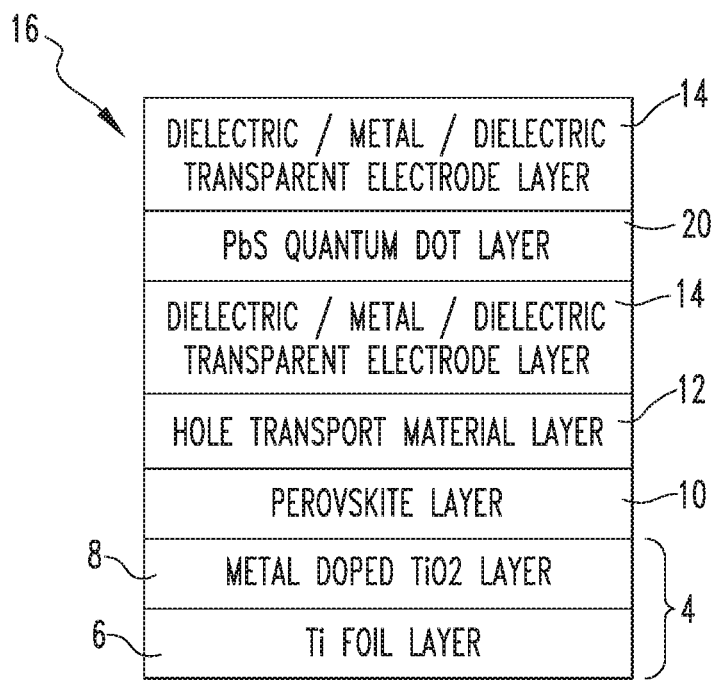
FIG. 2 is a schematic diagram of a tandem solar cell according to an alternative embodiment of the disclosed concept.

FIG. 2 is a schematic diagram of a tandem solar cell 16 according to an alternative embodiment of the disclosed concept. Tandem solar cell 16 is a stacked solar cell structure that includes a quantum dot solar cell 18 stacked on top of a perovskite solar cell 2 as described herein. More specifically, as seen in FIG. 2, quantum dot solar cell 18 includes a quantum dot layer 20, which, in the exemplary illustrated embodiment, is a lead sulfide (PbS) quantum dot layer, and a transparent electrode 14 as described elsewhere herein that is provided on the top surface of quantum dot layer 20. Quantum dot solar cell 18 is structured to absorb photons having a first bandgap energy (e.g., a high bandgap energy), and pass photons having a different, second bandgap energy (e.g., a low bandgap energy). Thus, in operation, as light illuminates tandem solar cell 16, photons having the first bandgap energy will be absorbed by quantum dot solar cell 18, and photons having the second bandgap energy that are not absorbed by quantum solar cell 18 will be absorbed by perovskite solar cell 2. Tandem solar cell 16 thus increases the absorption efficiency as compared to a solar cell structure including only a single type of solar cell.

Figure 3:
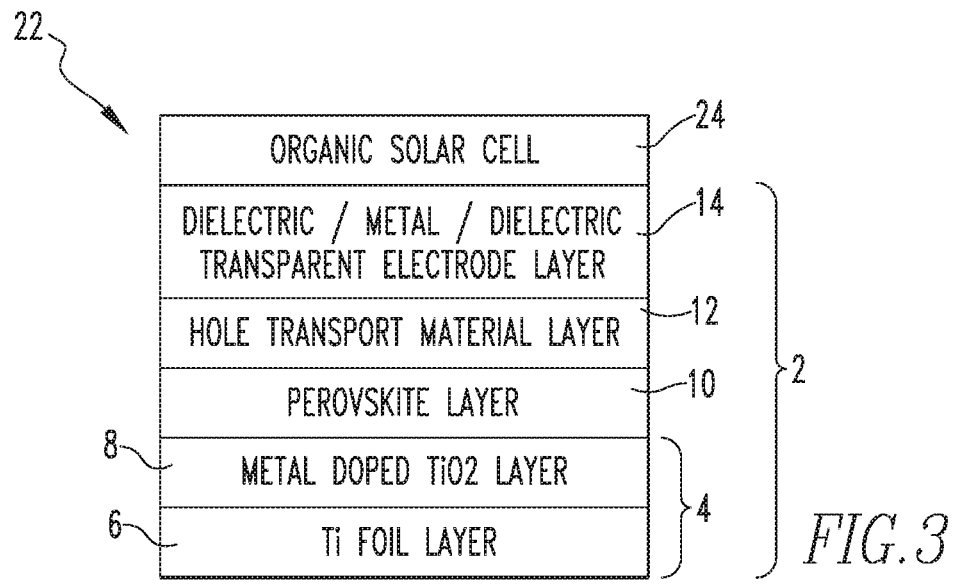
FIG. 3 is a schematic diagram of a tandem solar cell according to a further alternative embodiment of the disclosed concept.

FIG. 3 is a schematic diagram of a tandem solar cell 22 according to a further alternative embodiment of the disclosed concept. Tandem solar cell 22 is similar to tandem solar cell 16, except that tandem solar cell 22 includes an organic solar cell 24 instead of a quantum dot solar cell 18.

Figure 4:
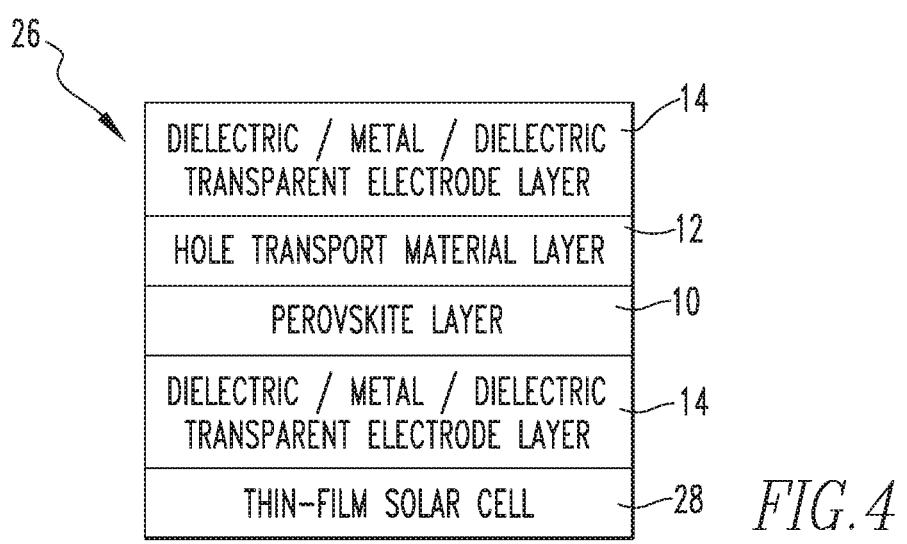
FIG. 4 is a schematic diagram of a tandem solar cell according to still a further alternative embodiment of the disclosed concept.

FIG. 4 is a schematic diagram of a tandem solar cell 26 according to still a further alternative embodiment of the disclosed concept. As described in detail below, tandem solar cell 26 is a thin-film-perovskite tandem cell structure. Tandem solar cell 26 includes a thin-film solar cell 28 which, in the non-limiting exemplary embodiment, is a Si thin-film solar cell wherein a thin-film of amorphous Si is deposited on a glass substrate. A transparent electrode 14 as described elsewhere herein is provided on the top surface of thin-film solar cell 28. A perovskite layer 10 as described elsewhere herein is provided on the top surface of transparent electrode 14, and a hole transport material layer 12 as described elsewhere herein is provided on the top surface of perovskite layer 10. Finally, a second transparent electrode 14 as described elsewhere herein is provided on the top surface of hole transport to layer 12. In tandem solar cell 26, the first transport electrode layer 14 functions as an interconnection for the device.

In the claims, any reference signs placed between parentheses shall not be construed as limiting the claim. The word "comprising" or "including" does not exclude the presence of elements or steps other than those listed in a claim. In a device claim enumerating several means, several of these means may be embodied by one and the same item of hardware. The word "a" or "an" preceding an element does not exclude the presence of a plurality of such elements. In any device claim enumerating several means, several of these means may be embodied by one and the same item of hardware. The mere fact that certain elements are recited in mutually different dependent claims does not indicate that these elements cannot be used in combination.

Although the invention has been described in detail for the purpose of illustration based on what is currently considered to be the most practical and preferred embodiments, it is to be understood that such detail is solely for that purpose and that the invention is not limited to the disclosed embodiments, but, on the contrary, is intended to cover modifications and equivalent arrangements that are within the spirit and scope of the appended claims. For example, it is to be understood that the present invention contemplates that, to the extent possible, one or more features of any embodiment can be combined with one or more features of any other embodiment.

What is claimed is:

1. A perovskite solar cell, comprising:
   a non-transparent flexible metal substrate, the flexible metal substrate being a bottom-most layer of the perovskite solar cell and comprising a metal doped TiO2 layer provided on top of a metal foil material made of a first metal, wherein the metal doped TiO2 layer is doped with a second metal different than the first metal other than titanium, the flexible metal substrate not including a plurality of nanoparticles;
   a perovskite layer; and
   a transparent electrode layer including a dielectric/metal/dielectric structure, wherein the perovskite layer is provided between the flexible metal substrate and the transparent electrode layer, wherein the transparent electrode layer is a top-most layer of the perovskite solar cell facing opposite to the bottom-most layer, and wherein the transparent electrode layer enables illumination of the perovskite layer through the transparent electrode layer.

2. The perovskite solar cell according to claim 1, wherein the first metal is titanium.

3. The perovskite solar cell according to claim 1, wherein the metal of the dielectric/metal/dielectric structure is Au, Al or Ag.

4. The perovskite solar cell according to claim 1, wherein the dielectric/metal/dielectric structure includes at least one of $TiO_2$, ZnO, MoO and NiO.

5. The perovskite solar cell according to claim 1, wherein the dielectric/metal/dielectric structure comprises MoO/Au/MoO, $TiO_2$/Au/MoO, ZnO/Ag/NiO, MoO/Al/MoO or MoO/Ag/NiO.

6. A perovskite solar cell, comprising:
   a flexible metal substrate, the flexible metal substrate being a bottom-most layer of the perovskite solar cell and including a metal doped $TiO_2$ layer, the flexible metal substrate not including a plurality of nanoparticles, wherein the metal doped $TiO_2$ layer is doped with a metal other than titanium;
   a perovskite layer; and
   a transparent electrode layer, wherein the perovskite layer is provided between the flexible metal substrate and the transparent electrode layer, wherein the transparent electrode layer is a top-most layer of the perovskite solar cell facing opposite to the bottom-most layer, and wherein the transparent electrode layer enables illumination of the perovskite layer through the transparent electrode layer.

7. The perovskite solar cell according to claim 6, wherein the metal doped $TiO_2$ layer is an aluminum doped $TiO_2$ layer.

8. The perovskite solar cell according to claim 6, wherein the metal doped $TiO_2$ layer is a niobium doped $TiO_2$ layer.

9. The perovskite solar cell according to claim 6, wherein the transparent electrode layer includes a dielectric/metal/dielectric structure.

10. The perovskite solar cell according to claim 6, wherein the flexible metal substrate includes a titanium foil layer, and wherein the metal doped $TiO_2$ layer is provided on the titanium foil layer.

11. The perovskite solar cell according to claim 1, wherein the second metal is aluminum.

12. The perovskite solar cell according to claim 1, wherein the second metal is tantalum.

13. The perovskite solar cell according to claim 1, wherein the second metal is iron.

14. The perovskite solar cell according to claim 1, wherein the second metal is niobium.

15. The perovskite solar cell according to claim 1, wherein the metal doped metal oxide layer is formed by providing a layer of the second metal on top of a layer of the first metal and performing a first annealing step followed by a second annealing step, wherein the first annealing step includes thermally oxidizing the layer of the second metal and the layer of the first metal at a first temperature, and wherein the second annealing step includes thermally oxidizing the layer of the second metal and the layer of the first metal at a second temperature in ambient oxygen.

16. The perovskite solar cell according to claim 15, wherein first temperature is 300-700° C. and the second temperate is 400° C.

17. The perovskite solar cell according to claim 6, wherein the metal doped $TiO_2$ layer is a tantalum doped $TiO_2$ layer.

18. The perovskite solar cell according to claim 6, wherein the metal doped $TiO_2$ layer is an iron doped $TiO_2$ layer.

* * * * *